(12) United States Patent
Caprara et al.

(10) Patent No.: US 7,447,245 B2
(45) Date of Patent: Nov. 4, 2008

(54) OPTICALLY PUMPED SEMICONDUCTOR LASER PUMPED OPTICAL PARAMETRIC OSCILLATOR

(75) Inventors: Andrea Caprara, Mountain View, CA (US); Luis A. Spinelli, Sunnyvale, CA (US); R. Russel Austin, Cool, CA (US)

(73) Assignee: Coherent, Inc., Santa Clara, CA (US)

( * ) Notice: Subject to any disclaimer, the term of this patent is extended or adjusted under 35 U.S.C. 154(b) by 67 days.

(21) Appl. No.: 11/801,538

(22) Filed: May 10, 2007

(65) Prior Publication Data

US 2007/0291801 A1    Dec. 20, 2007

Related U.S. Application Data

(60) Provisional application No. 60/814,765, filed on Jun. 19, 2006.

(51) Int. Cl.
*H01S 3/10*  (2006.01)
*H01S 3/08*  (2006.01)
*H01S 3/083* (2006.01)

(52) U.S. Cl. .............................. 372/22; 372/21; 372/23; 372/92; 372/94

(58) Field of Classification Search ............. 372/21–22, 372/92, 93, 94, 97, 98
See application file for complete search history.

(56) References Cited

U.S. PATENT DOCUMENTS

| | | | | |
|---|---|---|---|---|
| 5,870,415 A * | 2/1999 | Tsunekane | ..................... | 372/22 |
| 5,991,318 A * | 11/1999 | Caprara et al. | ................. | 372/22 |
| 6,097,742 A | 8/2000 | Caprara et al. | ................. | 372/22 |
| 6,130,900 A * | 10/2000 | Black et al. | .................... | 372/25 |
| 6,370,168 B1 * | 4/2002 | Spinelli | ........................ | 372/22 |
| 6,680,956 B2 * | 1/2004 | Gerstenberger et al. | ....... | 372/20 |
| 6,693,941 B1 * | 2/2004 | Okazaki et al. | ................ | 372/75 |
| H2122 H * | 9/2005 | Schepler | ....................... | 372/22 |
| 7,079,557 B1 * | 7/2006 | Yin et al. | ....................... | 372/22 |

\* cited by examiner

*Primary Examiner*—Minsun Harvey
*Assistant Examiner*—Phillip Nguyen
(74) *Attorney, Agent, or Firm*—Stallman & Pollock LLP

(57) ABSTRACT

An optically pumped semiconductor pumped optical parametric oscillator (OPS-pumped OPO) includes an OPS laser resonator and an OPO resonator A portion the OPS laser resonator axis and the OPO resonator axis are collinear. An optically nonlinear crystal is located in the coaxial portion of the resonators and arranged to frequency divide fundamental radiation generated in the OPS laser resonator into signal and idler radiations. In one arrangement, the OPO laser resonator is also an OPS resonator and is arranged to generate radiation at the wavelength of the signal radiation, with the idler radiation having the difference-frequency wavelength of the signal and fundamental radiations.

25 Claims, 7 Drawing Sheets

OPTICALLY PUMPED SEMICONDUCTOR LASER PUMPED OPTICAL PARAMETRIC OSCILLATOR

PRIORITY CLAIM

This application claims priority of U.S. Provisional Application No. 60/814,765, filed Jun. 19, 2006, the complete disclosure of which is hereby incorporated by reference.

TECHNICAL FIELD OF THE INVENTION

The present invention relates in general to external cavity optically pumped semiconductor (OPS) lasers. The invention relates in particular to an optical parametric oscillators (OPO) pumped by radiation from an OPS laser.

DISCUSSION OF BACKGROUND ART

Diode-pumped OPS lasers are now being increasingly used as an alternative to diode-pumped solid-state lasers. The most common OPS lasers employ gallium-arsenide-substrate (GaAs-substrate) based devices and provide fundamental radiation at a wavelength of about 980 nm or thereabouts. This is a preferred pump wavelength for fiber lasers. This fundamental wavelength can be frequency-doubled to provide radiation having a wavelength of about 490 nm that is useful in optical inspection apparatus and forensic lasers. The fundamental wavelength can also be frequency tripled or frequency quadrupled to provide ultraviolet radiation having wavelengths of about 327 nm or 245 nm respectively. These ultraviolet wavelengths are useful in optical inspection, machining, and optical lithography operations.

To date there has not been developed a commercial diode-pumped OPS laser capable of providing fundamental radiation at mid-IR wavelengths, for example, at wavelengths of about 1500 nm and longer. This would require development of an indium-phosphide-substrate OPS-structure. One possible reason for this is that there are no readily available diode-lasers that can be used for pumping such a structure even were one to be developed.

An alternative approach would be to frequency divide fundamental radiation of a 980 nm (or thereabouts) wavelength OPS by using the fundamental radiation to pump an OPO. By way of example, radiation having a wavelength between about 970 nm and 990 nm from a readily available, diode-pumped OPS laser could be frequency divided in an OPO to a signal portion having a wavelength between about 1321 nm and 1368 nm, and an idler portion having a wavelength between about 3585 nm and 3646 nm.

Two configurations of an OPS-pumped OPO are described in U.S. Pat. No. 5,991,318, the complete disclosure of which is hereby incorporated by reference. One configuration is a collinear configuration wherein an optically nonlinear crystal arranged for optical parametric frequency dividing is located in a common arm of a two-branch resonator formed by two mirrors and a mirror-structure of an OPS-structure. The other configuration is a non-collinear configuration including an OPS resonator and an OPO resonator having longitudinal axes intersecting in an optically nonlinear crystal arranged for optical parametric frequency dividing. It is believed that while these OPS-pumped OPO configurations can provide adequate frequency dividing, more complex configurations are required to optimize the frequency dividing process.

SUMMARY OF THE INVENTION

The present invention is directed to optimizing frequency-division in an OPS-laser-pumped optical parametric oscillator. In one aspect, apparatus in accordance with the present invention comprises, an OPS laser resonator including an OPS-structure. The OPS-structure includes a mirror-structure and a multilayer semiconductor gain-structure. The OPS laser resonator has an OPS resonator axis folded at least once by a fold-mirror. An arrangement is provided for energizing the gain-structure of the OPS-structure of the OPS laser resonator, thereby causing radiation having a fundamental wavelength to circulate in the OPS laser resonator. The apparatus also includes an OPO resonator having an OPO resonator axis folded by a polarizing beamsplitter. A portion of the OPS laser resonator axis and a portion of the OPO resonator axis are coaxial. An optically nonlinear crystal is located in the coaxial portion of the OPS laser and OPO resonators and arranged to frequency divide fundamental radiation generated in the OPS laser resonator.

In one preferred embodiment of the inventive apparatus, the optically nonlinear crystal is arranged for type-II frequency division and the polarizing beamsplitter is arranged to combine the OPS laser resonator axis and the OPO resonator axis into the collinear portion thereof. In another preferred embodiment of the inventive apparatus, the optically nonlinear crystal is arranged for type-III frequency division, the OPS laser resonator is folded additionally by the polarizing beamsplitter, the fold-mirror is arranged to combine the OPS laser resonator axis and the OPO resonator axis into the collinear portion thereof, and the polarizing beamsplitter is located in the coaxial portion of the resonators. In each of these embodiments, the fold-mirror is preferably a concave mirror.

DETAILED DESCRIPTION OF THE INVENTION

Figure 1:
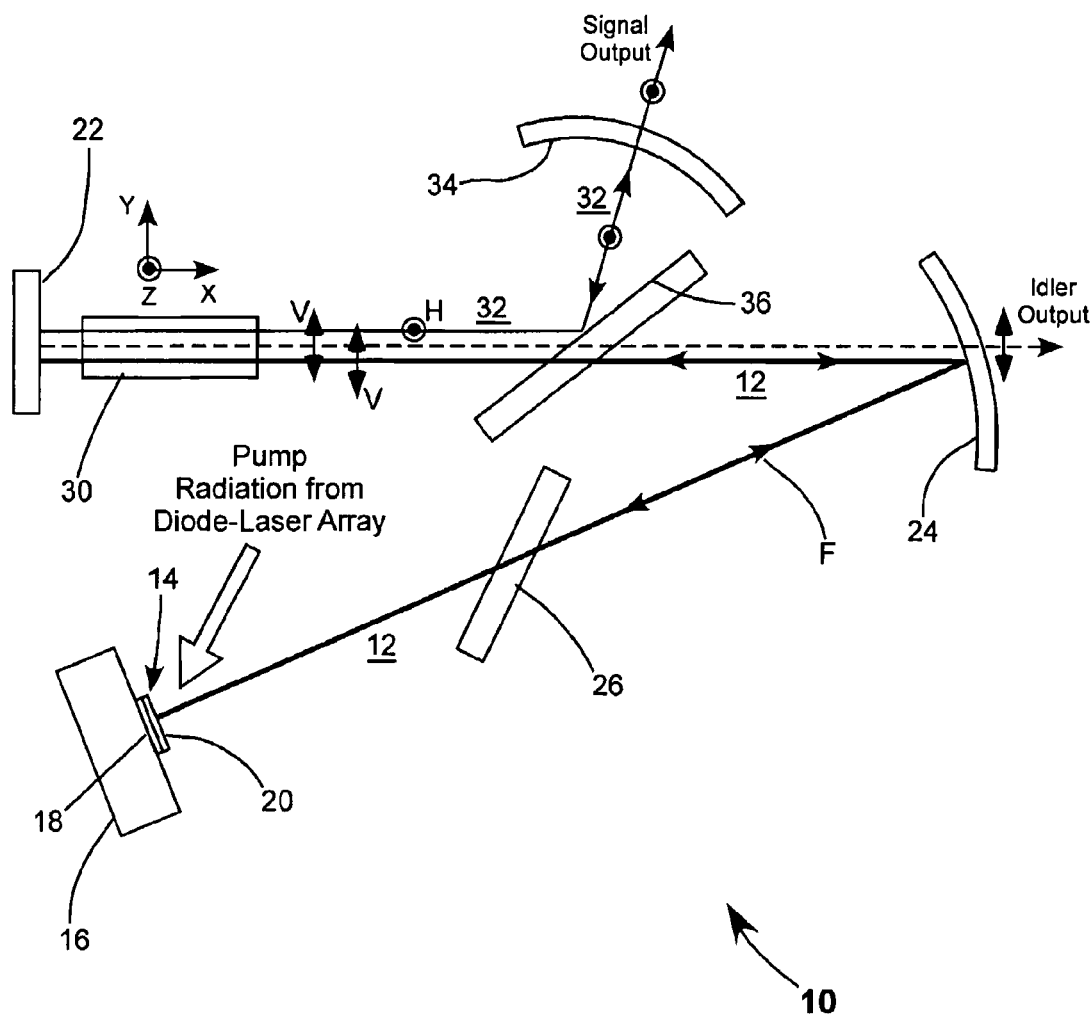
FIG. 1 schematically illustrates one preferred embodiment of an OPS-laser-pumped OPO in accordance with the present invention, including a fundamental resonator including an OPS-structure for generating fundamental radiation and folded by a fold-mirror, an optically nonlinear crystal located in the fundamental resonator and arranged for type-II optical parametric frequency-division of the fundamental radiation into signal radiation and idler radiation, a signal resonator partially collinear with the fundamental resonator and also including the optically nonlinear crystal, and a polarizing beamsplitter arranged to separate the signal radiation from the idler radiation and fundamental radiation, with the idler radiation being separated from the fundamental radiation by the fold mirror.

Turning now to the drawings, wherein like features are designated by like reference numerals, FIG. 1 schematically illustrates a preferred embodiment 10 laser apparatus in accordance with the present invention. Apparatus 10 includes a fundamental resonator 12 including an OPS (optically pumped semiconductor) structure (chip) 14 on a heat sink 16. Resonator 12 is referred to hereinafter as the OPS-resonator. The OPS-structure includes a mirror-structure 18 surmounted by a semiconductor multilayer gain-structure 20. The OPS-resonator is terminated by mirror-structure 18 of OPS-structure and a plane mirror 22 and folded by a concave dichroic mirror 24, which is highly reflective at the fundamental wavelength.

Gain-structure 20 of the OPS-structure is continuously energized (pumped) by pump radiation from a diode-laser array (not explicitly shown) causing continuous-wave (CW) fundamental radiation F, depicted in bold line, to circulate in the resonator. The wavelength of the circulating fundamental radiation is selected by a birefringent filter 26 having a center wavelength within, and a bandwidth less than, the gain-bandwidth of the gain-structure. A detailed description of OPS-structures and pumping arrangements therefore is presented in U.S. Pat. No. 6,097,742, assigned to the assignee of the present invention and the complete disclosure of which is hereby incorporated by reference.

Located in resonator 12 proximate mirror 22 is an optically nonlinear crystal 30 arranged for type-II optical parametric generation. The orientation of the X, Y, and Z-axes of the crystal is indicated in the drawing immediately above the crystal. Optical parametric generation can be referred to as frequency division, as a portion of the fundamental radiation circulating in the resonator is converted by the crystal into two frequencies of radiation, typically unequal, with the sum of the two frequencies being equal to the frequency of the fundamental radiation. The shorter of the two frequencies is usually designated the signal frequency and the other frequency is designated the idler frequency. The ratio of the power in the signal frequency to the power in the idler frequency ($P_S:P_I$) is equal to the ratio of the frequencies ($\omega_S:\omega_L$).

In type-II frequency division, the idler-frequency radiation is polarized in the same orientation as the fundamental-frequency radiation, and the signal-frequency radiation is polarized perpendicular to that orientation. In type-III frequency division, the signal-frequency radiation is polarized in the same orientation as the fundamental-frequency radiation, and the idler-frequency is polarized perpendicular to that orientation. In the apparatus of FIG. 1 the idler and fundamental are polarized in the plane of the drawing (in the X-Y plane of the crystal) as indicated by arrows V. The signal is polarized perpendicular to the plane of the drawing as indicated by arrows H.

A resonator 32 for the signal frequency is formed between a concave mirror 34 and plane mirror 22. Resonator 32 is folded by a polarizing dichroic mirror 36 that is highly reflective for signal-frequency radiation polarized as indicated (s-polarized with respect to mirror 16) and transparent to the fundamental and idler frequencies, which are p-polarized with respect to the transparent to mirror 16. Resonators 12 and 32 are about collinear (coaxial) in the region between mirrors 16 and 22 in which optically nonlinear crystal 30 is located.

Mirror 22 is highly reflective for the fundamental, signal, and idler frequencies. Mirror 34 is partially reflective and partially transmissive for the signal frequency. Mirror 24 is highly reflective for the fundamental frequency and highly transmissive for the idler frequency. Preferably mirror 34 has a radius of curvature and separation from mirror 22 such that the beam size of the signal beam in crystal 30, determined by resonator 32, is about equal to the beam size of the fundamental beam, determined by resonator 12, in the same crystal. By way of example, the radius of curvature of mirror 34 can be equal to about half the radius of curvature of mirror 24, and the spacing of mirror 34 and mirror 24 from mirror 22 can be about equal to the radius of curvature of mirror 34. This causes the mode shapes of circulating fundamental and signal radiations to be about the same and to have a beam waist in optically nonlinear crystal 30.

In one example of the apparatus of FIG. 1, in which crystal 30 is a potassium titanyl arsenate (KTA) crystal cut for a phase matching angle θ of 90° (non-critically phase matched) and a propagation angle Φ of 0°, mirror 22 preferably has a reflectivity greater than 99.95% at wavelengths between about 1054 nm and 1074 nm (a fundamental wavelength range of the OPS), a reflectivity greater than 99.9% at wavelengths between about 1520 nm and 1572 nm (the corresponding signal wavelength range), and a reflectivity greater than 99.0% at wavelengths between about 3390 nm 3425 nm (the corresponding idler wavelength range). Mirror 34 preferably has a reflectivity of about 97%±0.5% and a transmission of about 3±0.5% in the signal wavelength range and has a rear surface that is antireflection coated in that wavelength range. Mirror 24, preferably has a reflectivity greater than 99.95% in the fundamental wavelength range and a transmission greater than 95% in the idler wavelength range. The rear surface of mirror 24 is preferable antireflection coated in the idler wavelength range. Substrates for mirrors 34 and 24 are preferably made from IR grade calcium fluoride ($CaF_2$).

Polarizing mirror (beamsplitter) 36 is also preferably made from $CaF_2$. The incidence angle of the reflective surface of the mirror is preferably about 55°, i.e., about the Brewster angle. The reflective surface preferably has a reflectivity for s-polarized radiation in the signal wavelength range greater than 99%, a transmission for p-polarized radiation in the fundamental wavelength range of greater than 99.9%. and a transmission for p-polarized radiation in the idler wavelength range of greater than 99.5%. The front surface of beamsplitter 36 is provided with a dielectric coating which relies on a combination of polarization and wavelength discrimination to achieve the desired reflection and transmission characteristics. The rear surface of beamsplitter 36 does not need to be coated because of the Brewster angle incidence of radiation thereon.

Figure 2:
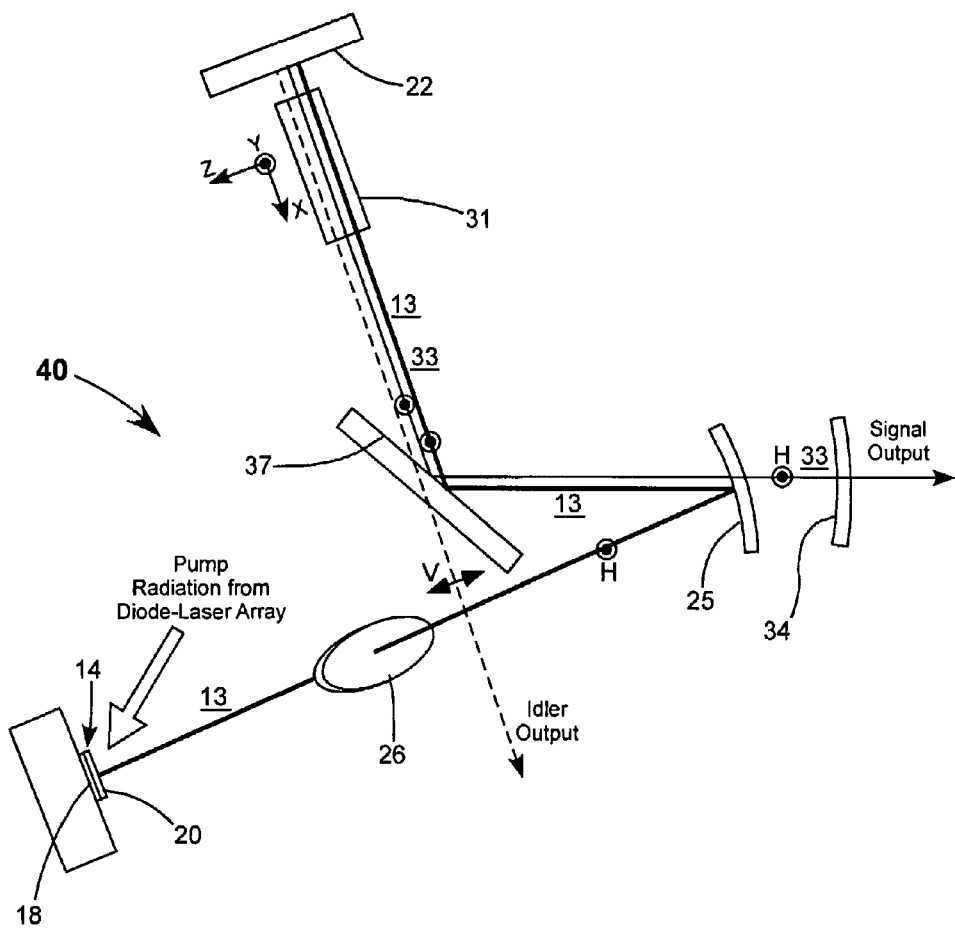
FIG. 2 schematically illustrates another preferred embodiment of an OPS-laser-pumped OPO in accordance with the present invention, similar to the embodiment of FIG. 1 but wherein the optically nonlinear crystal is arranged for type-III optical parametric frequency-division of the fundamental radiation, the polarizing beamsplitter is arranged to separate the idler radiation from the fundamental radiation and signal radiation and the resonator fold mirror separates the signal radiation from the fundamental radiation.

FIG. 2 schematically illustrates another preferred embodiment 40 of apparatus in accordance with the present invention. Apparatus 10 includes a fundamental resonator 13 including an OPS-resonator similar to that described above with reference to apparatus 10 of FIG. 1. Located in resonator 13 proximate mirror 22 is an optically nonlinear crystal 31 arranged for type-III optical parametric frequency-division.

In the apparatus of FIG. 2 the signal and fundamental radiations are polarized perpendicular to the plane of the drawing (in the X-Y plane of the crystal) as indicated by arrows H. The idler radiation is polarized in the plane of the drawing as indicated by arrows V.

A resonator 33 for the signal frequency is formed between a concave mirror 34 and plane mirror 22. Resonator 33 and fundamental resonator 13 are folded by a polarizing dichroic mirror 37 that is highly reflective for signal-frequency radiation and fundamental radiation polarized as indicated (s-polarized with respect to mirror 37) and transparent to the idler radiation, which is p-polarized with respect to mirror 37. Resonators 13 and 33 are about collinear in the region between mirrors 25 and 22. Optically nonlinear crystal 31 is located in the collinear region, here between mirror 37 and mirror 22.

Mirror 22 is highly reflective for the fundamental, signal, and idler radiations. Mirror 34 is partially reflective and partially transmissive for the signal frequency radiation. Mirror 25 is highly reflective for the fundamental radiation and highly transmissive for the signal radiation.

In one example of the apparatus of FIG. 2, in which crystal 30 is a rubidium titanyl arsenate (RTA) crystal cut for a phase-matching angle θ of 90° and a propagation angle Φ of 0°, mirror 22 preferably has a reflectivity greater than 99.95% at wavelengths between about 1054 nm and 1074 nm (a fundamental wavelength range of the OPS), a reflectivity greater than 99.9% at wavelengths between about 1588 nm and 1624 nm (the corresponding signal wavelength range), and a reflectivity greater than 99.0% at wavelengths between about 3133 nm 3170 nm (the corresponding idler wavelength range). Mirror 34 preferably has a reflectivity of about 97%±0.5% and a transmission of about 3±0.5% in the signal wavelength range and has a rear surface that is antireflection coated in that wavelength range. Mirror 25, preferably has a reflectivity greater than 99.95% in the fundamental wavelength range and a transmission greater than 99.8% in the signal wavelength range. The rear surface of mirror 25 is preferably antireflection coated in signal wavelength range. Substrates for mirrors 34 and 25 are preferably made from IR grade calcium fluoride ($CaF_2$).

Polarizing mirror (beamsplitter) 37 is also preferably made from $CaF_2$. The incidence angle of the reflective surface of the mirror is preferably about 54.7°, i.e., about the Brewster angle. The reflective surface preferably has a reflectivity for s-polarized radiation in the signal wavelength and fundamental wavelength ranges greater than 99.9%, and a transmission for p-polarized radiation in the idler wavelength range of greater than 99.9%. The rear surface of beamsplitter 37 does not need to be coated because of the Brewster angle incidence of idler radiation thereon.

Figure 3:
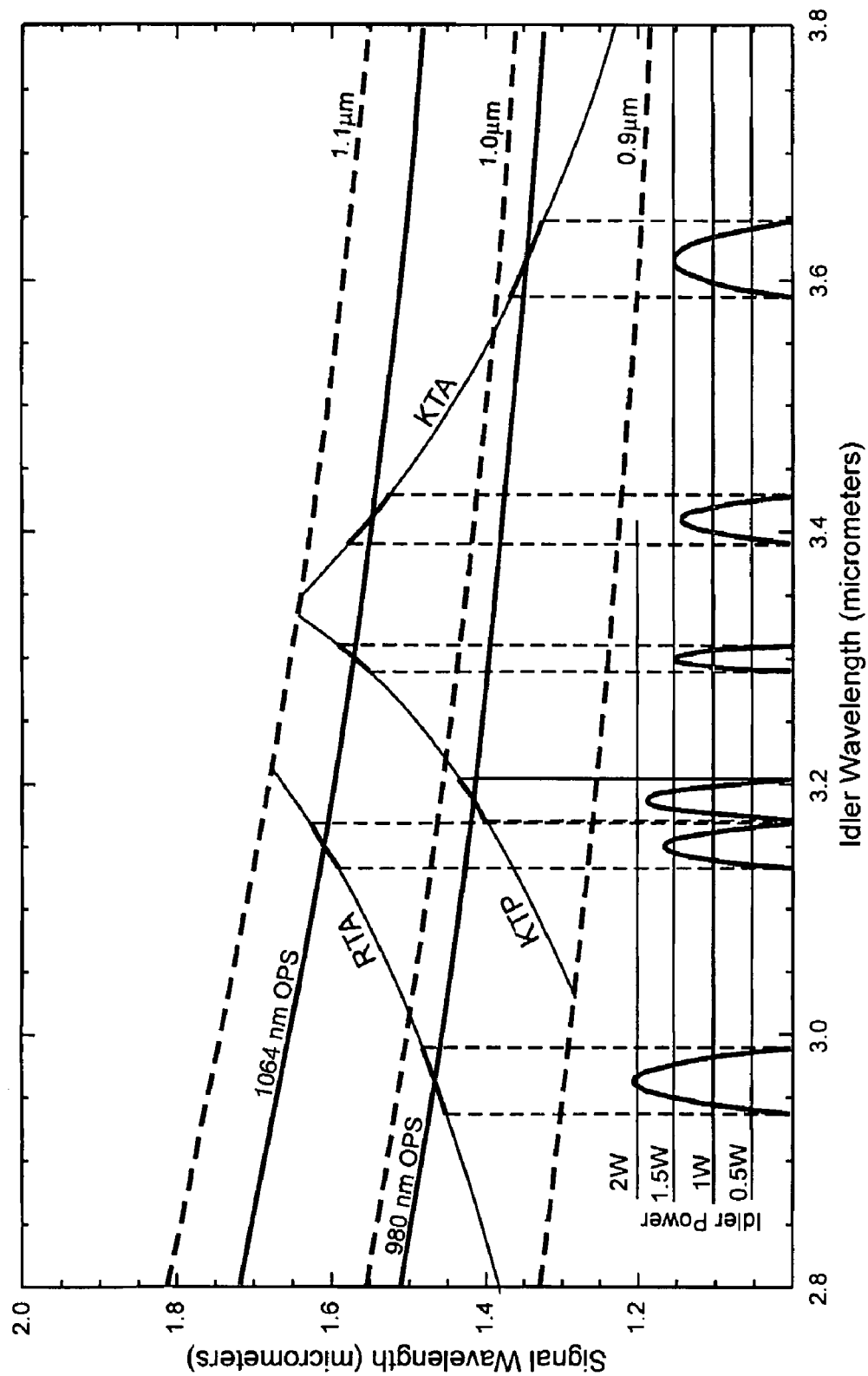
FIG. 3 is a graph schematically illustrating computed signal and idler wavelengths for a range of pump wavelengths between 0.9 μm and 1.1 μm for KTA, RTA and potassium titanyl phosphate (KTP) crystal cut for a 90° phase-matching angle θ in an example of the apparatus of FIG. 2.

FIG. 3 is a graph schematically illustrating computed signal and idler wavelengths for a range of pump (fundamental) wavelengths between 0.9 μm and 1.1 μm for KTA, RTA and potassium titanyl phosphate (KTP) crystal cut for a 90° phase-matching angle θ (type-II or III) in an example of the apparatus of FIG. 2. The pump wavelength range is bounded by bold dashed lines, with bold solid lines depicting specific pump wavelengths of 980 nm and 1064 nm (0.980 μm and 1.064 μm). In the lower portion of the graph are six curves depicting the calculated idler power for each crystal type for the two specific wavelengths varied (tuned) by ±10 nm about the nominal value. Such tuning could be accomplished by rotating BRF 26 as is known in the art. It is assumed in the calculations that 70 W of pump power are delivered to the OPS gain-structure and that the beam size (beam waist) in the optically nonlinear crystal is about 50.0 μm (1/e2 radius). In these examples, the highest peak idler-power (about 2 W) is obtained for RTA pumped at 980 nm. Estimated signal power at this idler power is about 5 W.

Figure 4:
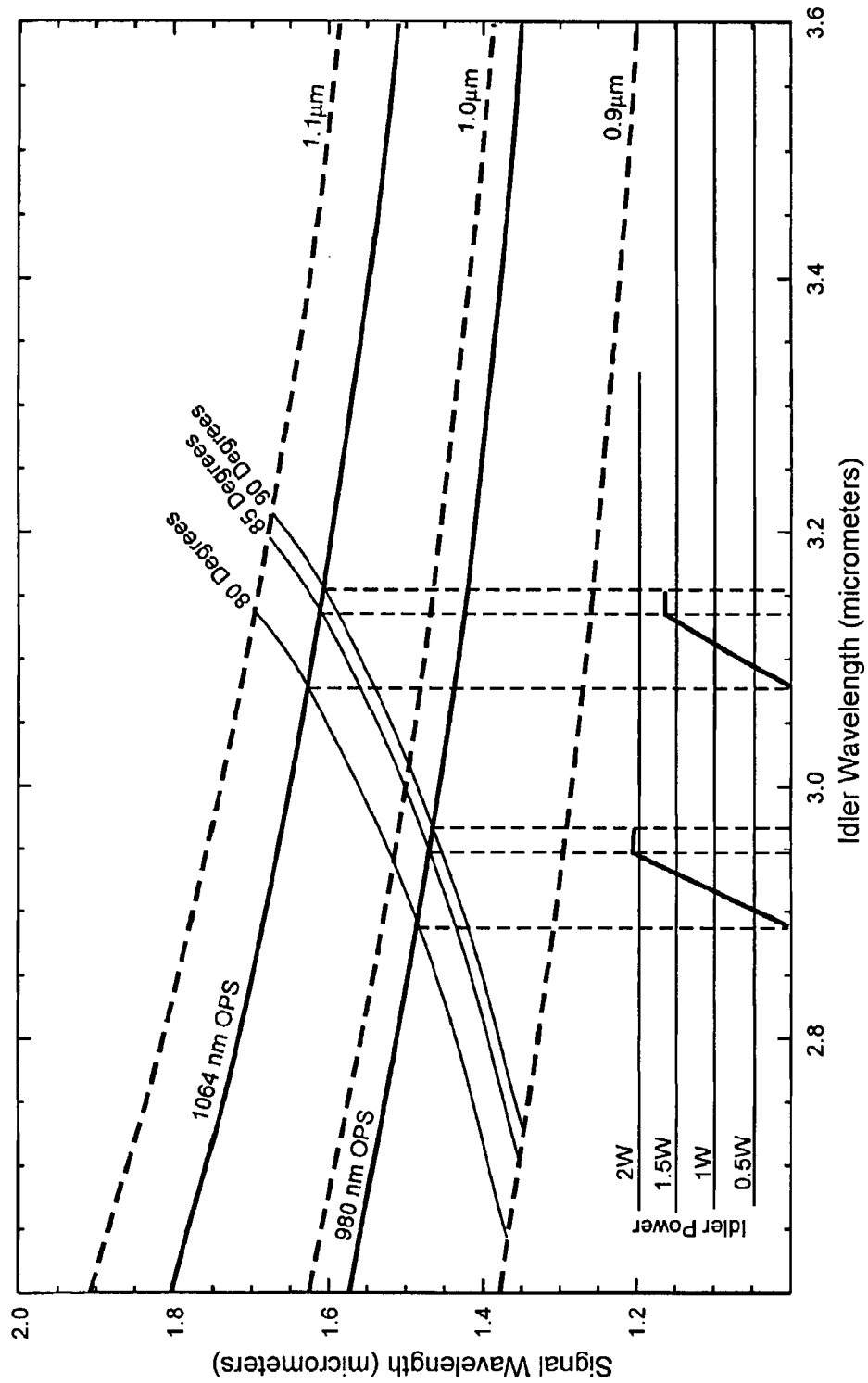
FIG. 4 is a graph schematically illustrating computed signal and idler wavelengths for a range of pump wavelengths between 0.9 μm and 1.1 μm for an RTA crystal cut for a 90° phase-matching angle θ in an example of the apparatus of FIG. 2 and depicting idler power variation as the idler wavelength is selectively tuned by selectively tilting the RTA crystal such that effective phase-matching angle varies between 80° and the nominal 90°.

FIG. 4 is a graph schematically illustrating computed signal and idler wavelengths for a range of pump wavelengths between 0.9 μm and 1.1 μm for an RTA crystal cut for a 90° phase-matching angle θ in an example of the apparatus of FIG. 2 and depicting the idler wavelength tuned by selectively tilting the RTA crystal such that effective phase-matching angle varies between 80° and the nominal 90°. Again, the pump wavelength range is bounded by bold dashed lines, with bold solid lines depicting specific pump wavelengths of 980 nm and 1064 nm. Curves in the lower portion of the graph (one for each of the specific pump wavelengths) indicate the variation of idler power as the idler wavelength is tuned, and indicate that peak idler power is relatively independent of effective phase-matching angle between 85° and 90°.

Figure 5:
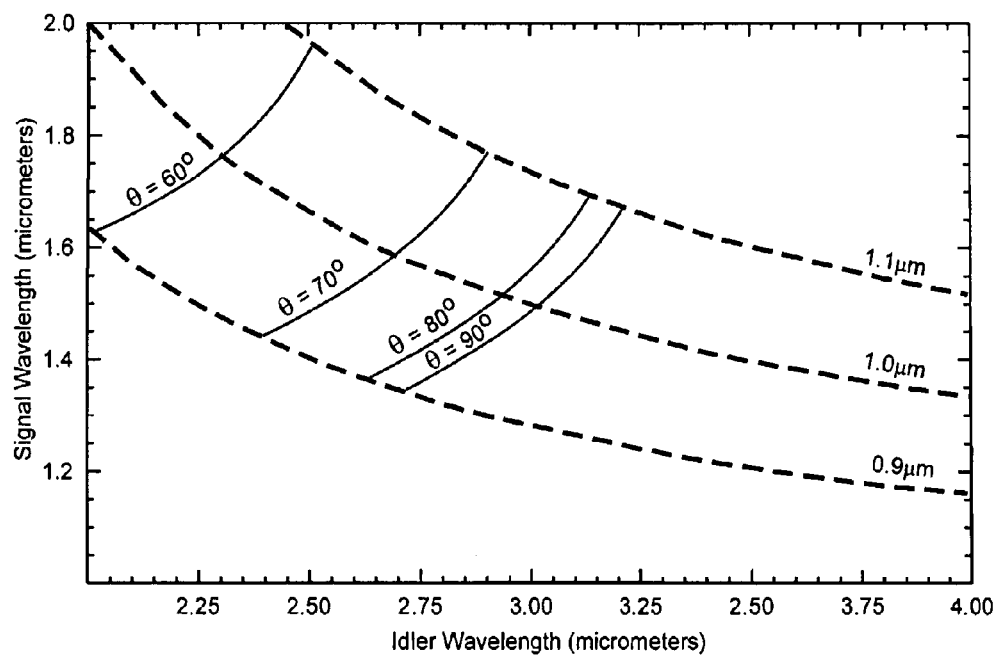
FIG. 5 is a graph schematically illustrating computed signal and idler wavelengths for a range of pump wavelengths between 0.9 μm and 1.1 μm for RTA crystals cut for a range of phase-matching angles θ between 60 and 90 in an example of the apparatus of FIG. 2.
Figure 5A:
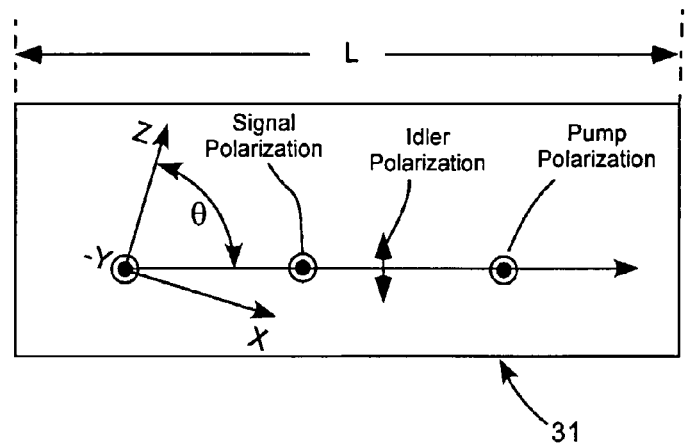
FIG. 5A schematically illustrates the phase-matching angle relative to the crystal-axes and the polarization-orientation of the fundamental, signal, and idler radiation assumed in the computation of FIG. 5.

FIG. 5 is a graph schematically illustrating computed signal and idler wavelengths for a range of pump wavelengths between 0.9 μm and 1.1 μm for RTA crystals cut for a range of phase-matching angles θ between 60 and 90 in an example of the apparatus of FIG. 2. The phase matching angle relative to the crystal-axes and the polarization orientation of the fundamental, signal, and idler radiation is schematically depicted in FIG. 5A. In the graph of FIG. 5, the crystal is assumed to be in the form of a rectangular parallelepiped having a length L of 3.5 mm.

Figure 6:
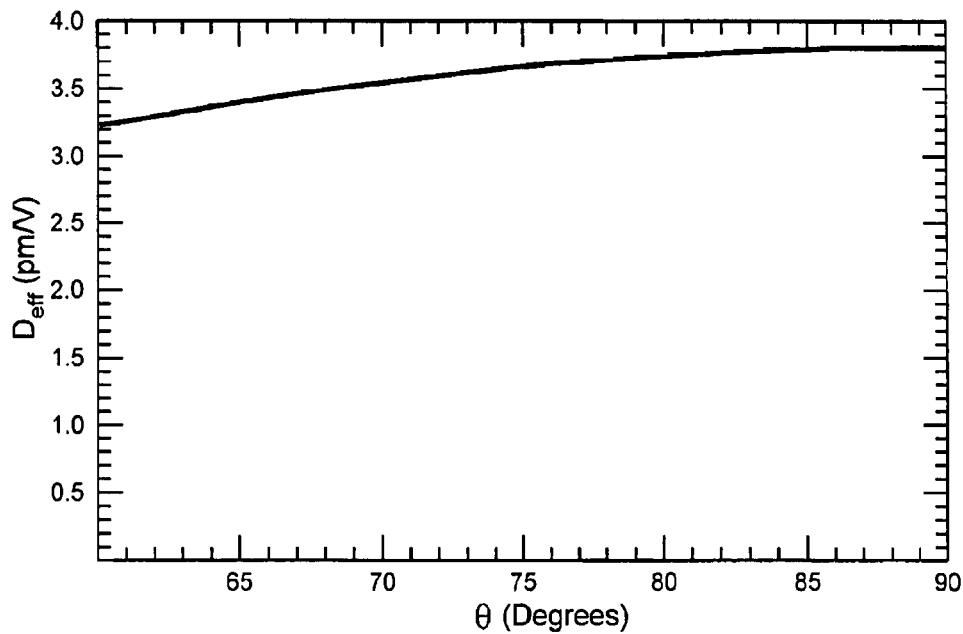
FIG. 6 is a graph schematically illustrating the effective nonlinear coefficient ($D_{eff}$) as a function of phase-matching angle for the RTA crystal in the computation of FIG. 5.
Figure 7:
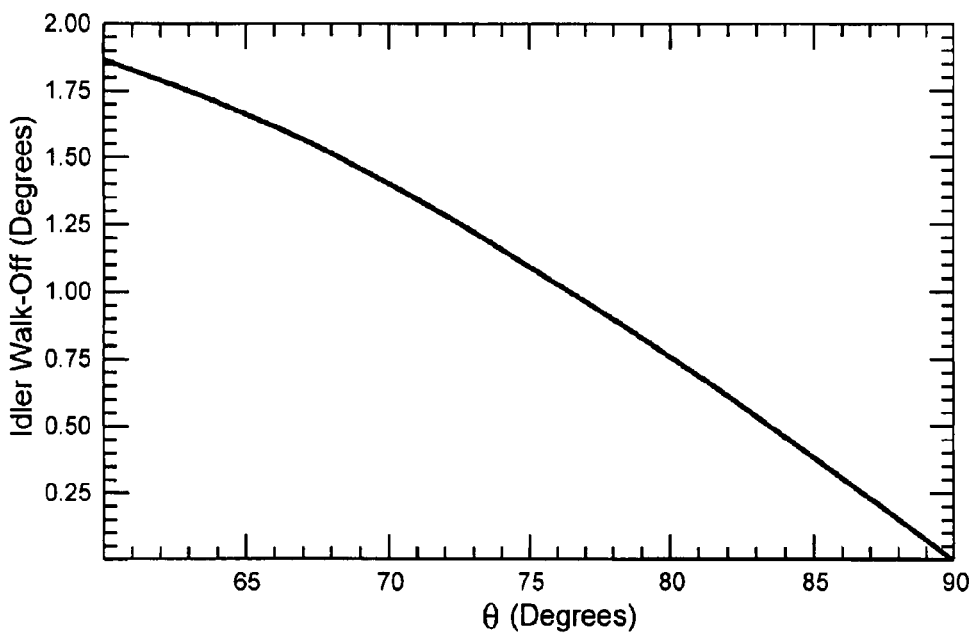
FIG. 7 is a graph schematically illustrating idler walk-off angle as a function of phase-matching angle for the RTA crystal in the computation of FIG. 5.

FIG. 6 is a graph schematically illustrating the effective nonlinear coefficient ($D_{eff}$) for as a function of phase-matching angle for the RTA crystal in the computation of FIG. 5. FIG. 7 is a graph schematically illustrating idler walk-off angle with respect to the signal propagation direction as a function of phase-matching angle for the RTA crystal in the computation of FIG. 5. It can be seen that $D_{eff}$ is optimum at a phase-matching angle of 90 consistent with a zero walk-off angle of the idler radiation.

It should be noted here that the examples provided above are just a portion of examples considered in evaluating the potential of the present invention for generating mid-IR wavelengths by frequency-dividing the fundamental wavelength of an OPS laser resonator. These particular examples indicate the highest estimated idler power, and are sufficient to illustrate principles of the present invention. Other examples may be preferred for reasons such as a particular wavelength range of interest or a degree of tunability. It should also be noted that the present invention is not limited to the use of the optically nonlinear crystal materials KTA, RTA, and KTP. Other optically nonlinear crystals having an appropriate wavelength-range of transparency may be used without departing from the spirit and scope of the present invention. Results obtained, however, may be different from those estimated or calculated in the above-presented description.

Figure 8:
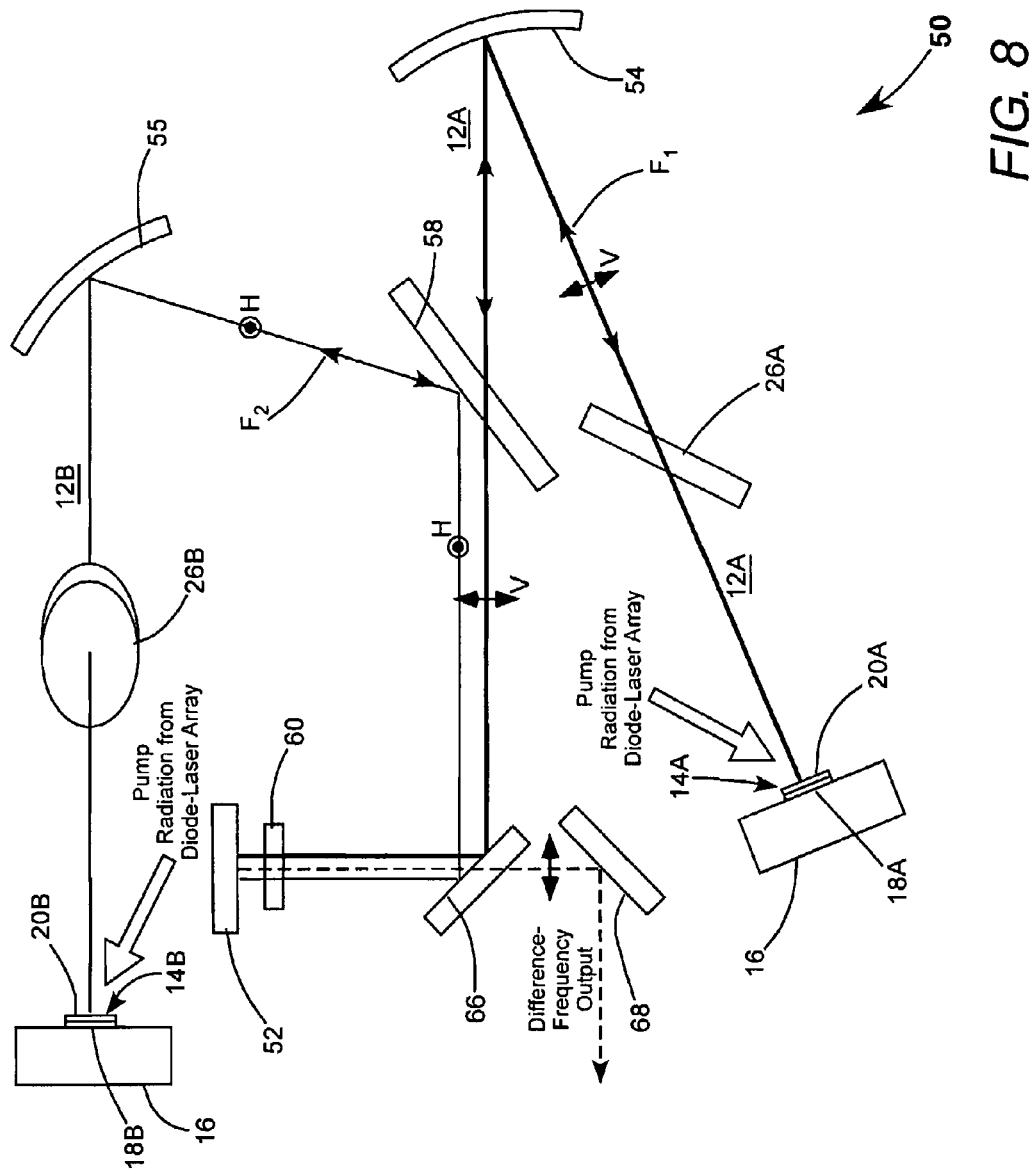
FIG. 8 schematically illustrates a preferred embodiment of an OPS difference-frequency generator including two OPS laser resonators arranged with a portion of one resonator coaxial with a portion of the other and with an optically nonlinear crystal in the coaxial portions arranged for difference frequency mixing.

FIG. 8 schematically illustrates a preferred embodiment 50 of an OPS difference frequency generator in accordance with the present invention. Apparatus 50 is capable, with suitable choice of an optically nonlinear conversion crystal, of generating wavelengths longer than 4.0 μm (4000 nm) by mixing fundamental radiation of OPS gain-structures having fundamental wavelengths between about 700 nm and 1100 nm. One relatively newly discovered crystal lithium gallium selenide (LGSE) is transparent at wavelengths between about 370 nm and 13200 nm and accommodates difference-frequency phase matching of wavelengths shorter than about 1100 nm Apparatus 50, in the example depicted in FIG. 8, is assumed to be arranged for generating 9700 nm radiation. This wavelength is selected as it is a useful wavelength for electronic circuit board manufacturing that is presently commercially available only from carbon dioxide ($CO_2$) lasers.

The apparatus includes two OPS-laser resonators 12A and 12B. OPS resonators 12A and 12B include OPS-structures structure 14A and 14B respectively, each thereof on a heat sink 16. The resonators are terminated by common, plane mirror 52 and the mirror-structures 18A and 18B the corresponding OPS-structures of the OPS-structure therein. Mirror 52 is highly reflective at the fundamental wavelengths of resonators 12A and 12B and at the difference-frequency wavelength. Resonator 12A is folded by a concave mirror 54. Resonator 12B is folded by a concave mirror 55 and a polarization-dependent beamsplitter/combiner (polarizing beamsplitter) 58. Both resonators are folded by a dichroic mirror 66.

A birefringent filter 26A is located in resonator 12A, and a birefringent filter 26B is included in resonator 12B. The birefringent filters have the wavelength-selection function described above, and are oriented with respect to each other such that fundamental radiation $F_1$ circulating in resonator 12A is polarized in a plane orthogonal to the polarization plane of fundamental radiation $F_2$ circulating in resonator 12B as indicated in FIG. 8 by arrows V and arrowheads H. This allows the resonator axes to be coaxial between polarizing beamsplitter 58 and common resonator mirror 52.

Located in the coaxial region of the resonators between mirror 66 and mirror 52 is an optically nonlinear crystal 60 (LGSE in this example) cut for type-II difference-frequency generation. Mirror 66 is coated for maximum reflection at the two fundamental wavelengths and maximum transmission at the difference frequency wavelength. Radiation having the difference frequency is generated in a double pass of the fundamental radiation through the crystal and exits the apparatus via mirror 66.

A difference-frequency output at a wavelength of about 9700 nm can be generated in LGSE if the wavelength of $F_1$ is about 1064 nm and the wavelength of $F_2$ is about 959 nm. The crystal is preferably cut such that radiation propagates in the X-Z plane of the crystal ($\Phi=0$) with a phase matching angle of about 54° at a temperature 293° K. In this arrangement, there is a walk-off angle of about 23.8 milliradians in the crystal between the 1064 nm radiation and the 959 nm radiation. This limits the interaction length between the two radiations to about 1.0 mm for beam diameters of 50.0 μm in the crystal. LGSE, however, has a relatively very high $D_{eff}$ of about −6.62 pm/V and initial calculations indicate that for a pump power of 70 W delivered to each OPS-structure a single-mode output power of at least about 3.5 W at 9700 nm (9.7 μm) is possible. This indicates that the inventive apparatus has efficiency comparable to the efficiency of low power, sealed-off, waveguide $CO_2$ lasers at the same output wavelength.

Apparatus 50, while described here as a difference-frequency generator can be considered as a collinearly pumped OPO in which the 959 nm radiation is the pump radiation and resonator 12A is the signal-wavelength resonator and in which the idler-wavelength power is boosted by adding additional radiation at the signal wavelength (1064 nm) through the of OPS-structure 14A. In an apparatus 50 without an OPS-structure 14A in resonator 12A the 9700 nm output power would be only about 1.2 W It should be noted here that apparatus 50 is not limited to generating the 9700 nm wavelength of the above-discussed example. Longer or shorter wavelengths may be generated depending on the choice of the material of optically nonlinear crystal 60.

In summary, the present invention is described above with reference to a preferred and other embodiments. The invention, however, is not limited to the embodiments described and depicted herein. Rather the invention is limited only by the claims appended hereto.

What is claimed is:

1. Optical apparatus, comprising:
   an OPS laser resonator including an OPS-structure, the OPS-structure including a mirror-structure and a multilayer semiconductor gain-structure the OPS laser resonator having a resonator-axis folded at least once by a fold-mirror;
   an arrangement for energizing the gain-structure of the OPS-structure of the OPS laser resonator thereby causing radiation having a fundamental wavelength to circulate in the OPS laser resonator;
   an OPO resonator having an OPO resonator axis folded by a polarizing beamsplitter, a portion of the OPS laser resonator axis and the OPO resonator axis being coaxial; and
   an optically nonlinear crystal located in the coaxial portion of the OPS laser and OPO resonators and arranged to frequency divide fundamental wavelength radiation circulating in the OPS laser resonator.

2. The apparatus of claim 1, wherein the optically nonlinear crystal is arranged for type-II frequency division and the polarizing beamsplitter is arranged to combine the OPS laser resonator axis and the OPO resonator axis into the collinear portion thereof.

3. The apparatus of claim 1, wherein the optically nonlinear crystal is arranged for type-III frequency division, the OPS laser resonator is folded additionally by the polarizing beamsplitter, the fold-mirror is arranged to combine the OPS laser resonator axis and the OPO resonator axis into the collinear portion thereof, and the polarizing beamsplitter is located in the collinear portion of the resonators.

4. The apparatus of claim 1, wherein the fold-mirror is a concave mirror.

5. The apparatus of claim 1, wherein the fundamental radiation is divided into signal radiation having a wavelength longer than the fundamental wavelength and idler radiation having a wavelength longer than the wavelength of the signal radiation, and wherein the apparatus is arranged such that signal radiation circulates in the OPO resonator.

6. The apparatus of claim 5, wherein the optically nonlinear crystal is one of a KTA crystal and RTA crystal, a KTP crystal, and an LGSE crystal.

7. The apparatus of claim 5, wherein the OPO resonator also includes an OPS-structure including a mirror-structure and a gain-structure, and an arrangement for energizing the gain-structure, with the gain-structure of the OPS-structure in the OPO resonator being arranged to generate signal wavelength radiation when energized.

8. The apparatus of claim 7, wherein the optically nonlinear crystal is an LGSE crystal.

9. Optical apparatus, comprising:
an OPS laser resonator including an OPS-structure, the OPS-structure including a mirror-structure and a multilayer semiconductor gain-structure the OPS laser resonator having a resonator-axis folded by a fold-mirror;
an optical pumping arrangement for energizing the gain-structure thereby causing fundamental radiation to circulate in the OPS laser resonator;
an OPO resonator having an OPO resonator axis folded by a polarizing beamsplitter, the polarizing beamsplitter being arranged to combine the OPS laser resonator axis and the OPO resonator axis such that a portion of the OPS laser resonator axis and the OPO resonator axis are coaxial;
an optically nonlinear crystal located in the coaxial portion of the OPS laser and OPO resonators and arranged to frequency divide the fundamental radiation circulating in the OPS laser resonator to provide signal radiation having a wavelength longer than the wavelength of the fundamental radiation, and idler radiation having a wavelength longer than the signal-wavelength radiation; and
wherein signal radiation circulates in the OPO resonator and idler radiation is transmitted by the polarizing beamsplitter and the fold mirror of the OPS laser resonator out of the apparatus.

10. The apparatus of claim 9, wherein the optically nonlinear crystal is arranged for type-II frequency division, the fundamental and idler radiations are plane-polarized in the same orientation and the signal radiation is plane-polarized in an orientation perpendicular to the polarization-orientation of the fundamental and idler radiations.

11. The apparatus of claim 10, wherein the polarizing beamsplitter is arranged such that fundamental, signal and idler radiations are non-normally incident thereon and the polarization-orientation of the signal radiation is perpendicular to the plane of incidence of the polarizing beamsplitter.

12. The apparatus of claim 9, wherein the OPS laser resonator is terminated by the mirror-structure of the OPS-structure and a plane mirror, the OPO resonator is terminated by a concave mirror and the plane mirror, and the fold mirror of the OPS laser resonator is a concave mirror.

13. The apparatus of claim 12, wherein the concave terminating mirror of the OPO resonator has a radius of curvature and separation from the OPO and OPS resonator plane terminating mirror such that the beam size of the fundamental radiation and the beam size of the signal radiation are about equal.

14. The apparatus of claim 9, wherein the material of the optically nonlinear crystal is one of a KTA crystal, an RTA crystal, and a KTP crystal.

15. Optical apparatus, comprising:
an OPS laser resonator including an OPS-structure, the OPS-structure including a mirror-structure and a multilayer semiconductor gain-structure the OPS laser resonator having a resonator-axis folded by a fold-mirror and by a polarizing beamsplitter;
an optical pumping arrangement for energizing the gain-structure thereby causing fundamental radiation to circulate in the OPS laser resonator;
an OPO resonator having an OPO resonator axis folded by the polarizing beamsplitter the OPO resonator and OPS laser resonator being arranged such that a portion of the OPS laser resonator axis and the OPO resonator axis are coaxial with the polarizing beamsplitter being located in this coaxial portion of the resonators;
an optically nonlinear crystal located in the coaxial portion of the OPS laser and OPO resonators and arranged to frequency divide the fundamental radiation circulating in the OPS laser resonator to provide signal radiation having a wavelength longer than the wavelength of the fundamental radiation, and idler radiation having a wavelength longer than the signal-wavelength radiation; and
wherein signal radiation circulates in the OPO resonator and idler radiation is transmitted by the polarizing beamsplitter out of the apparatus.

16. The apparatus of claim 15, wherein the optically nonlinear crystal is arranged for type-III frequency division, the fundamental and signal radiations are plane-polarized in the same orientation and the idler radiation is plane-polarized in an orientation perpendicular to the polarization-orientation of the fundamental and idler radiations.

17. The apparatus of claim 15, wherein the polarizing beamsplitter is arranged such that fundamental, signal and idler radiations are non-normally incident thereon and the polarization-orientation of the idler radiation is parallel to the plane of incidence of the polarizing beamsplitter.

18. The apparatus of claim 17, wherein the OPS laser resonator is terminated by the mirror-structure of the OPS-structure and a plane mirror, the OPO resonator is terminated by a concave mirror and the plane mirror, and the fold mirror of the OPS laser resonator is a concave mirror.

19. The apparatus of claim 18, wherein the concave fold mirror of the OPS resonator is transmissive to signal radiation, the concave terminating mirror of the OPO resonator is positioned such that signal radiation circulates therein through the concave fold mirror of the OPS resonator, and the coaxial portion of the resonators is between the concave fold mirror of the OPS resonator and the plane mirror.

20. The apparatus of claim 15, wherein the material of the optically nonlinear crystal is one of a KTA crystal, an RTA crystal, and a KTP crystal.

21. Optical apparatus, comprising:
a first OPS laser resonator including a first OPS-structure, the OPS-structure including a mirror-structure and a multilayer semiconductor gain-structure the first OPS laser resonator having a first resonator-axis;
an arrangement for energizing the gain-structure of the first OPS-structure thereby causing radiation having a first wavelength to circulate in the first OPS laser resonator;
a second OPS laser resonator including a second OPS-structure, the second OPS-structure including a mirror-structure and a multilayer semiconductor gain-structure, the second OPS laser resonator having a second resonator-axis and being arranged cooperative with the first OPS laser resonator such that a portion of the first resonator axis is coaxial with the first resonator axis;
an arrangement for energizing the gain-structure of the second OPS-structure thereby causing radiation having a second wavelength to circulate in the second OPS laser resonator, the second wavelength being different from the first wavelength; and
an optically nonlinear crystal located in the coaxial portion of the first and second OPS laser resonators and arranged to generate radiation having the difference-frequency wavelength of the first and second wavelengths.

22. The apparatus of claim 21, wherein the first OPS laser resonator is terminated by the mirror-structure of the first OPS-structure and a common mirror and the second OPS laser resonator is terminated by the mirror-structure of the second OPS-structure and the common mirror and the coaxial portion of the first and second resonators terminates on the common mirror.

23. The apparatus of claim 22, wherein the coaxial portion of the first and second OPS laser resonators is folded by a fold mirror reflective for the first and second wavelengths and transmissive for the difference frequency wavelength and the optically nonlinear crystal is located between the fold mirror and the common mirror.

24. The apparatus of claim 23, wherein the common mirror is highly reflective for the first, second, and third wavelengths whereby the difference frequency radiation is generated by a double-pass of the first and second wavelength radiations through the optically nonlinear crystal and delivered from the apparatus via the fold mirror.

25. The apparatus of claim 21, wherein the optically nonlinear crystal is an LGSE crystal.

* * * * *